United States Patent
Huang

(10) Patent No.: US 11,894,388 B2
(45) Date of Patent: Feb. 6, 2024

(54) METHOD ADAPTED TO MANUFACTURE ARRAY SUBSTRATE AND DISPLAY PANEL

(71) Applicant: HKC CORPORATION LIMITED, Shenzhen (CN)

(72) Inventor: Bei Zhou Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/974,533

(22) Filed: Oct. 27, 2022

(65) Prior Publication Data

US 2023/0048505 A1    Feb. 16, 2023

Related U.S. Application Data

(62) Division of application No. 16/313,064, filed on Dec. 24, 2018, now Pat. No. 11,515,335.

(51) Int. Cl.
*H01L 27/12* (2006.01)
*G02F 1/1368* (2006.01)

(52) U.S. Cl.
CPC ........ *H01L 27/1225* (2013.01); *G02F 1/1368* (2013.01); *H01L 27/1237* (2013.01); *H01L 27/1288* (2013.01)

(58) Field of Classification Search
CPC ............. H01L 27/1225; H01L 27/1237; H01L 27/1288; G02F 1/1368
USPC .......................................................... 257/59
See application file for complete search history.

(56) References Cited

U.S. PATENT DOCUMENTS

2008/0111934 A1* 5/2008 Wu .................... H01L 27/1255
                                                    257/E27.113
2017/0110527 A1* 4/2017 Li ....................... H01L 27/1248

* cited by examiner

*Primary Examiner* — Ori Nadav

(57) ABSTRACT

The application discloses a method adapted to manufacture an array substrate and a display panel. The method includes: forming a photoresist layer, a source and a drain; post-baking the photoresist layer, so that the photoresist layer flows to the position of a channel; etching a semiconductor layer to obtain a preset pattern; and peeling off the photoresist layer.

9 Claims, 4 Drawing Sheets

METHOD ADAPTED TO MANUFACTURE ARRAY SUBSTRATE AND DISPLAY PANEL

CROSS-REFERENCES TO RELATED APPLICATION

This application is a division of U.S. patent application Ser. No. 16/313,064 filed Dec. 24, 2018, which is hereby incorporated by reference herein in its entirety.

TECHNICAL FIELD

The present disclosure relates to the field of display technologies, and in particular, to a method adapted to manufacture an array substrate and a display panel.

BACKGROUND

The description herein provides only background information related to the present disclosure, but does not necessarily constitute the existing technology.

With the development and advancement of science and technologies, owing to hotspot features such as thinness, power saving, and low radiation, liquid crystal displays become mainstream products of displays and are widely applied. Most liquid crystal displays known to the inventor are backlight liquid crystal displays. The backlight liquid crystal display includes a liquid crystal panel and a backlight module. The working principle of the liquid crystal panel is: Liquid crystal molecules are placed between two parallel glass substrates, and a drive voltage is applied across the two glass substrates to control rotating directions of the liquid crystal molecules, so that light in the backlight module is refracted out to generate an image.

Currently, thin film transistor-liquid crystal displays (TFT-LCD) have gradually occupied a leading status in the display field due to their performance such as low power consumption, fabulous image quality, and a relatively high production yield. Similarly, the TFT-LCD includes a liquid crystal panel and a backlight module. The liquid crystal panel includes a color filter substrate (CF substrate), a thin film transistor array substrate (Thin Film Transistor Substrate, TFT Substrate), and a mask. Two transparent electrodes exist at opposite inner sides of the substrates. A liquid crystal (LC) layer is sandwiched between the two substrates.

In the manufacturing process of an array, an etching stop layer (ESL) structure can protect a TFT back channel when a metal line is etched, which makes the manufacturing process relatively easy. Therefore, the ESL structure is applied. However, the manufacturing process of the TFT having the ESL structure includes six masks, which causes an increase in time and costs compared with a five-mask manufacturing process.

SUMMARY

The present disclosure provides a method adapted to manufacture an array substrate and a display panel, to simplify a mask manufacturing process and effectively reduce production costs.

To achieve the foregoing objective, the present disclosure provides a method adapted to manufacture an array substrate, comprising:

forming a gate metal layer and a gate insulating layer on a glass substrate;

forming a semiconductor layer on a first surface of the gate insulating layer, and forming an etching stop layer at a position of a channel of a thin film transistor;

forming a metal layer on a first surface of the etching stop layer, depositing a layer of photoresist on a first surface of the metal layer, and performing one mask manufacturing process on the photoresist to form a photoresist layer of a preset shape through exposure development; and obtaining a source and a drain through etching;

post-baking the photoresist layer remained on first surfaces of the source and the drain, so that the photoresist layer flows to the position of the channel;

etching the semiconductor layer to obtain a preset pattern;

peeling off the photoresist layer on the first surfaces of the source, the drain and the position of the channel; and forming a passivation layer and an ITO layer on the first surfaces of the source, the drain and the position of the channel.

The present disclosure further provides a display panel, comprising an array substrate manufactured according to the method adapted to manufacture an array substrate disclosed in this application, a contralateral substrate arranged opposite to the array substrate, and a liquid crystal layer sandwiched between the array substrate and the contralateral substrate.

According to the manufacturing process method in the present disclosure, one less mask is used in a manufacturing process of the TFT having the ESL structure. Specifically, after the source and the drain are etched, the photoresist on the first surfaces of the source and the drain is not removed or peeled off temporarily. Instead, for the TFT, and especially, for the photoresist layer on the first surfaces of the source and the drain, a post-baking operation is subsequently performed. The photoresist layer easily flows after baking, and diffuses outside the source and the drain into the channel in which the ESL structure is located. A photoresist layer is formed on the first surface of the ESL structure corresponding to the channel. In this way, the photoresist layer can take an effect of stopping etching together with the ESL layer in the subsequent step of etching the semiconductor layer. In this way, for the TFT, the photoresist layer can be formed on the first surface of the ESL structure without additionally adding a mask. In addition, a better etching stop effect is achieved than that achieved when the semiconductor layer is etched after the photoresist layer is peeled off, thereby improving the yield of products while simplifying a mask manufacturing process.

BRIEF DESCRIPTION OF DRAWINGS

The accompanying drawings included are used to provide an understanding of the embodiments of this application. The accompanying drawings constitute a part of this specification, and can illustrate examples of implementations of this application and explain the principle of this application together with the text description. Obviously, the accompanying drawings in the following description are merely some embodiments of this application. For a person of ordinary skill in the art, the person may obtain other drawings according to these accompanying drawings without creative effects. In the accompanying drawings.

DETAILED DESCRIPTION

Figure 1:
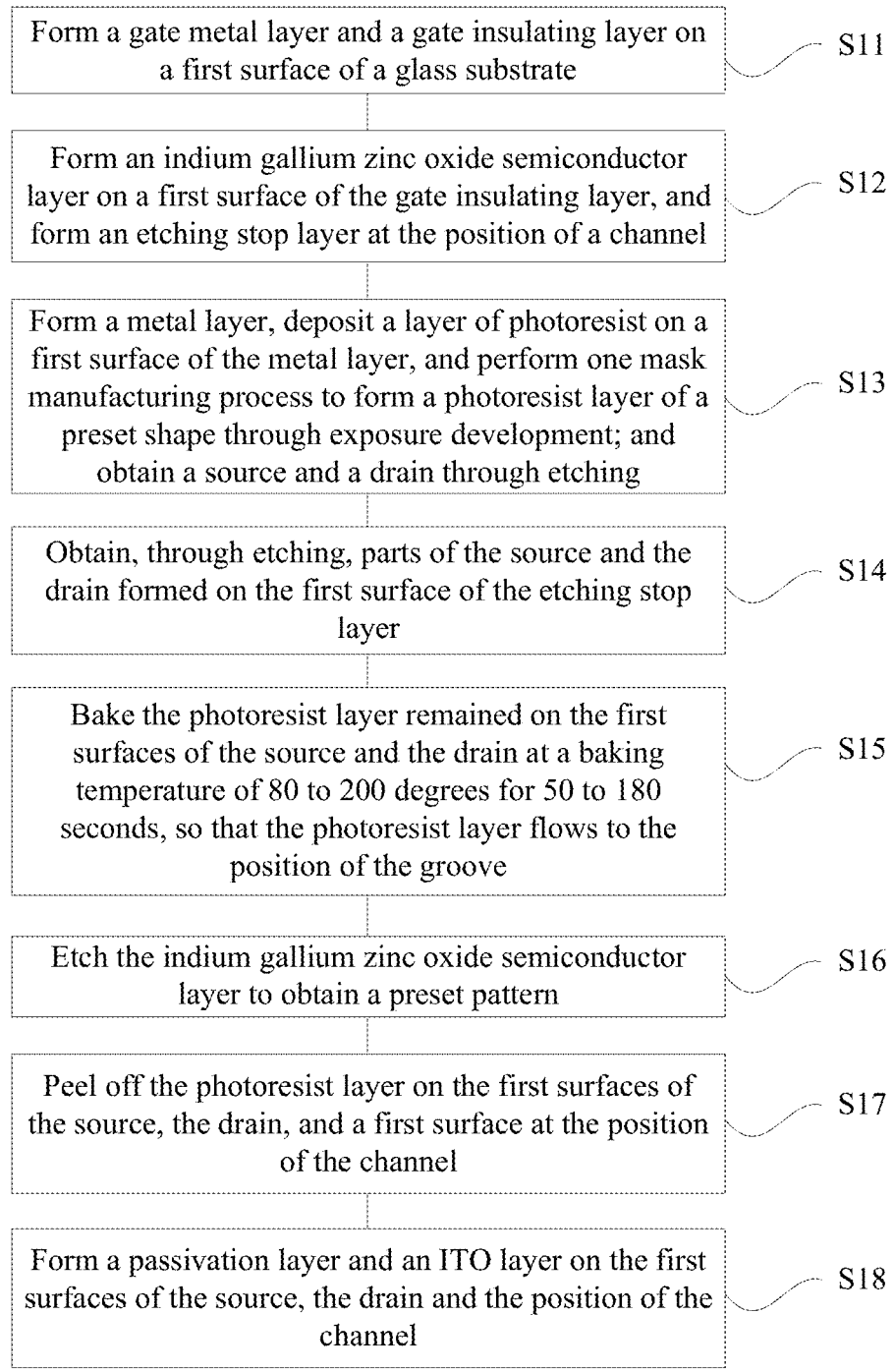
FIG. 1 is a flowchart of a method adapted to manufacture an array substrate according to an embodiment of the present disclosure.

Specific structures and functional details disclosed herein are merely representative, and are intended to describe the objectives of exemplary embodiments of the present disclosure. However, the present disclosure may be specifically implemented in many alternative forms, and should not be construed as being limited to the embodiments set forth herein.

In the description of the present disclosure, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of the present disclosure. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly include one or more of said features. In the description of the present disclosure, unless otherwise stated, "a plurality of" means two or more than two. In addition, the terms "include", "comprise" and any variant thereof are intended to cover non-exclusive inclusion.

In the description of the present disclosure, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in the present disclosure according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in this specification, specify the presence of stated features, integers, steps, operations, elements, and/or components, but do not preclude the presence or addition of one or more other features, integers, steps, operations, elements, components, and/or combinations thereof.

In figures, units of similar structures are represented by using a same reference number.

An ESL structure (etching stop layer) generally exists in a manufacturing process of an oxide semiconductor array. The ESL structure can protect a TFT back channel when a metal line is etched, which makes the manufacturing process relatively easy.

However, a manufacturing process of a TFT having the ESL structure includes six masks, which causes an increase in time and costs compared with a general five-mask manufacturing process of a non-ESL structure. Therefore, the applicant uses the five-mask manufacturing process in the solution not disclosed. After a source and a drain are obtained after etching, a photoresist is no longer formed on a first surface of the ESL structure, but instead, a solution in which the ESL structure is used as a protective layer of a TFT back channel is used. However, in such an operation, it is insufficient to resist oxide etching acid only by using the ESL as the protective layer of the TFT back channel in a process of etching an oxide semiconductor layer (such as indium gallium zinc oxide (IGZO)), and it cannot achieve a desirable performance protection effect the same as that achieved by a solution in which the ESL and a photoresist (PR) glue are both used as the protective layer, known to the applicant.

Therefore, the applicant of the present disclosure makes an improvement and obtains the following solutions, to better protect the electrical characteristics of a TFT back channel.

Figure 2:
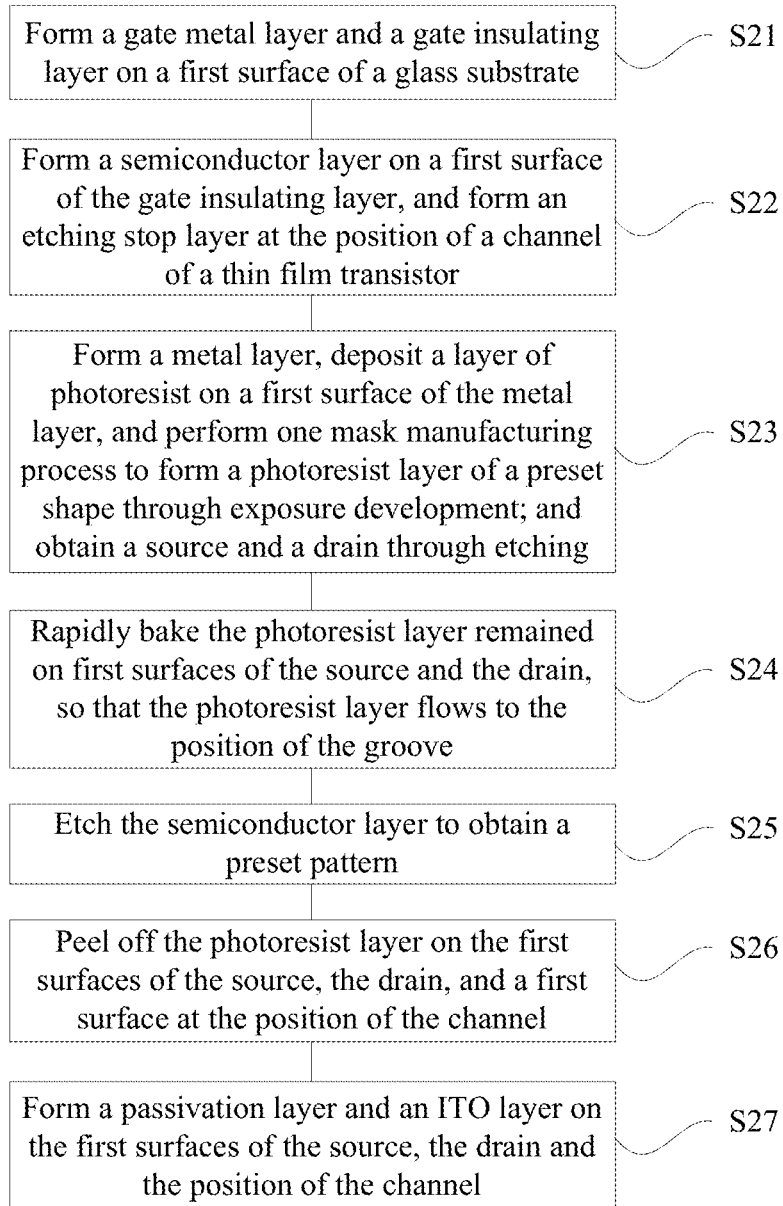
FIG. 2 is a flowchart of another method adapted to manufacture an array substrate according to an embodiment of the present disclosure.
Figure 3:
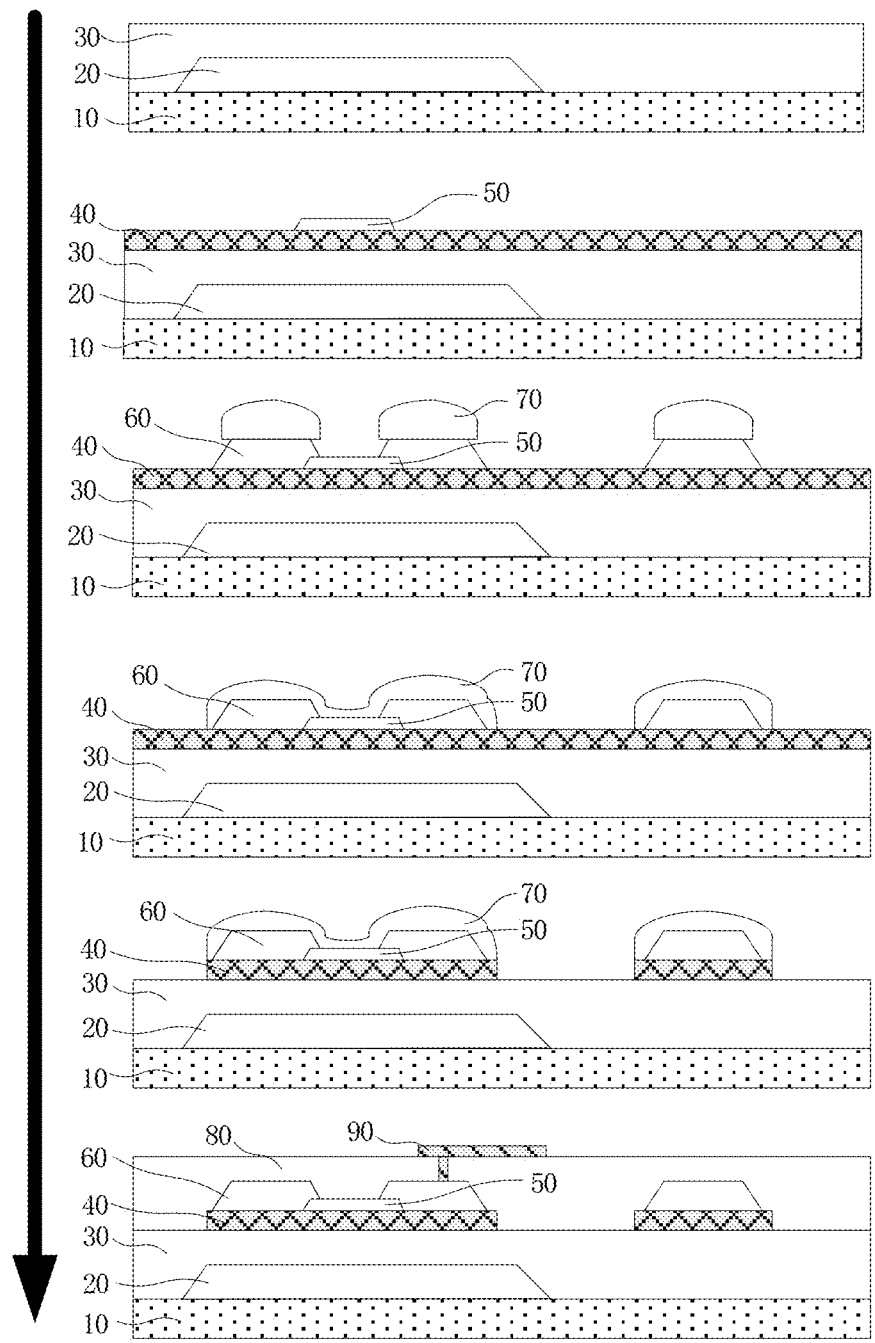
FIG. 3 is a schematic structural diagram of a manufacturing procedure corresponding to a manufacturing process method according to an embodiment of the present disclosure.
Figure 4:
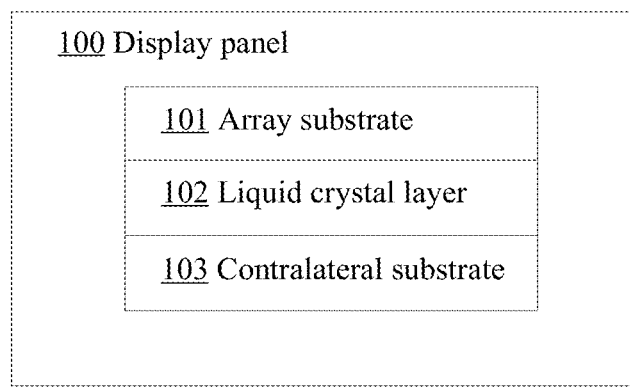
FIG. 4 is a schematic diagram of a display panel according to an embodiment of the present disclosure.

FIG. 1 is a flowchart of a method adapted to manufacture an array substrate according to the present disclosure. FIG. 2 is a flowchart of another method adapted to manufacture an array substrate according to the present disclosure. FIG. 3 is a schematic diagram of a manufacturing process structure corresponding to a manufacturing process method according to the present disclosure. FIG. 4 is a schematic diagram of a display panel according to the present disclosure. Based on FIG. 1, and with reference to FIG. 2 to FIG. 4, the following may be learned:

The present disclosure discloses a method adapted to manufacture an array substrate, including:

S11: Form a gate metal layer and a gate insulating layer on a first surface of a glass substrate, where when the gate metal layer is formed, a scanning line metal layer can be formed in a same mask manufacturing process, so that fewer masks are used in a manufacturing process of an entire panel, and costs are reduced.

S12: Form an indium gallium zinc oxide semiconductor layer on a first surface of the gate insulating layer, and form an etching stop layer at a position of a channel of a thin film transistor.

S13: Form a metal layer on a first surface of the etching stop layer, deposit a layer of photoresist on a first surface of the metal layer, and perform one mask manufacturing process on the photoresist to form a photoresist layer of a preset shape through exposure development.

S14: Obtain, through etching, parts of a source and a drain formed on the first surface of the etching stop layer. Specifically, the width of the formed etching stop layer is greater than the width of the channel between the source and the drain. Meanwhile, the parts of the source and the drain close to the channel are formed on the first surface of the etching stop layer. When the source and the drain are formed, a data line metal layer can be formed on the same layer, so that fewer masks are used in the manufacturing process of the entire panel, and the costs are reduced.

S15: Bake the photoresist layer remained on first surfaces of the source and the drain at a baking temperature of 80 to 200 degrees for 50 to 180 seconds, so that the photoresist layer flows to the position of the channel. In a manufacturing process of a new panel in which the baking temperature and the baking time cannot be determined, a baking temperature of 200 degrees and a baking time of 180 seconds can be preferably used, then the baking temperature and the baking time can be considered to be progressively reduced or added when needed.

S16: Etch the indium gallium zinc oxide semiconductor layer to obtain a preset pattern.

S17: Peel off the photoresist layer on the first surfaces of the source, the drain, and a first surface at the position of the channel.

S18: Form a passivation layer and an ITO layer on the first surfaces of the source, the drain and the position of the channel.

The first surfaces of the source, the drain and the position of the channel refer to the upper surfaces of the source, the drain and the position of the channel, or the surfaces of the source, the drain and the position of the channel away from the glass substrate; and by analogy, a first surface of another component in this application also refers to the upper surface of the component or the surface of the component away from the glass substrate.

According to the manufacturing process method in the present disclosure, in a TFT manufacturing process including an indium gallium zinc oxide semiconductor layer, a corresponding indium gallium zinc oxide semiconductor layer uses an ESL, and one less mask is used in the manufacturing process of the TFT having the ESL structure. Specifically, after the source and the drain are etched, the photoresist on the first surfaces of the source and the drain is not removed or peeled off temporarily. Instead, for the TFT, and especially, for the photoresist layer on the first surfaces of the source and the drain, a post-baking operation is subsequently performed. The photoresist layer easily flows after baking, and diffuses outside the source and the drain into the channel in which the ESL structure is located. A photoresist layer is formed on the first surface of the ESL structure corresponding to the channel. In this way, the photoresist layer can take an effect of stopping etching together with the ESL layer in the subsequent step of etching the semiconductor layer. In this way, for the TFT, the photoresist layer can be formed on the first surface of the ESL structure without additionally adding a mask. In addition, a better etching stop effect is achieved than that achieved when the semiconductor layer is etched after the photoresist layer is peeled off, thereby improving the yield of products while simplifying a mask manufacturing process. Moreover, because the width of the formed etching stop layer is greater than the width of the channel between the source and the drain, and parts of the source and the drain close to the channel are formed on the first surface of the etching stop layer, the etching stop layer fully avoids contact between the channel and the indium gallium zinc oxide semiconductor layer, and avoids an impact caused by an etching liquid that in-flows from the channel on the indium gallium zinc oxide semiconductor layer, thereby improving a performance protection effect.

FIG. 2 is a flowchart of another method adapted to manufacture an array substrate according to the present disclosure. Referring to FIG. 2, and with reference to FIG. 1 and FIG. 3, the following may be learned:

The present disclosure further discloses a method adapted to manufacture an array substrate, including:

S21: Form a gate metal layer and a gate insulating layer on a first surface of a glass substrate.

S22: Form a semiconductor layer on a first surface of the gate insulating layer, and form an etching stop layer at a position of a channel of a thin film transistor.

S23: Form a metal layer on a first surface of the etching stop layer, deposit a layer of photoresist on a first surface of the metal layer, and perform one mask manufacturing process on the photoresist to form a photoresist layer of a preset shape through exposure development; and obtain a source and a drain through etching.

S24: Post-bake the photoresist layer remained on first surfaces of the source and the drain, so that the photoresist layer flows to the position of the channel.

S25: Etch the semiconductor layer to obtain a preset pattern.

S26: Peel off the photoresist layer on the first surfaces of the source, the drain, and a first surface at the position of the channel.

S27: Form a passivation layer and an ITO layer on the first surfaces of the source, the drain and the position of the channel.

The position of the channel refers to a recessed position on the first surface of the ESL structure, between the source and the drain.

According to the manufacturing process method in the present disclosure, one less mask is used in a manufacturing process of the TFT having the ESL structure. Specifically, after the source and the drain are etched, the photoresist on the first surfaces of the source and the drain is not removed or peeled off temporarily. Instead, for the TFT, and especially, for the photoresist layer on the first surfaces of the source and the drain, a post-baking operation is subsequently performed. The photoresist layer easily flows after baking, and diffuses outside the source and the drain into the channel in which the ESL structure is located. A photoresist layer is formed on the first surface of the ESL structure corresponding to the channel. In this way, the photoresist layer can take an effect of stopping etching together with the ESL layer in the subsequent step of etching the semiconductor layer. In this way, for the TFT, the photoresist layer can be formed on the first surface of the ESL structure without additionally adding a mask. In addition, a better etching stop effect is achieved than that achieved when the semiconductor layer is etched after the photoresist layer is peeled off, thereby improving the yield of products while simplifying a mask manufacturing process.

Optionally, in this embodiment, the width of the etching stop layer is greater than the width of the channel between the source and the drain.

In this solution, the width of the etching stop layer is greater than the width of the channel between the source and the drain, that is, the etching stop layer fully prevents the channel from being in contact with the semiconductor layer, and avoids an impact on the semiconductor layer that is caused by an etching liquid that in-flows from the channel, thereby achieving a desirable performance protection effect.

Optionally, in this embodiment, parts of the source and the drain close to the channel are formed on the first surface of the etching stop layer.

In this solution, the parts of the source and the drain close to the channel are formed on the first surface of the etching stop layer. This avoids a gap occurring between the source and the drain when the source and the drain are formed beside the etching stop layer and etching is not perfectly performed, and avoids an impact on the performance of the semiconductor that is caused by an external etching liquid in the gap, thereby ensuring a protection performance effect.

Optionally, in this embodiment, the semiconductor layer includes an oxide semiconductor layer.

In this solution, the ESL is generally used in a manufacturing process of an oxide semiconductor array. Metal lines are etched substantially, so that TFT back channels are effectively protected, making the manufacturing process relatively easier and improving the production efficiency.

Optionally, in this embodiment, the oxide semiconductor layer includes an indium gallium zinc oxide semiconductor layer (that is, IGZO).

In this solution, the ESL is generally used in a manufacturing process of an oxide semiconductor array, and particularly in a manufacturing process of an IGZO array. Metal lines are etched substantially, so that TFT back channels are effectively protected, making the manufacturing process relatively easier and improving the production efficiency.

Optionally, in this embodiment, the step of post-baking the photoresist layer remained on first surfaces of the source and the drain, so that the photoresist layer flows to the position of the channel includes:

baking the photoresist layer remained on the first surfaces of the source and the drain at a baking temperature of 80 to 200 degrees for 50 to 180 seconds.

In this solution, according to a specific condition, through adjustment, the photoresist on the first surfaces of the source and the drain is baked at a baking temperature of 80 to 200 degrees for 50 to 180 seconds, to reduce other problems caused by insufficient photoresist flowing or over-baking, so that the photoresist can desirably flow to the channel and fully cover or substantially cover the channel, take an effect in anti-etching together with the ESL structure, and improve the protection performance. If it cannot be determined whether a baking objective is completed (that is, the photoresist covers the surface at the position of the channel), the first surface may be baked at the maximum baking temperature for the maximum baking time as much as possible, or even baked for a longer time. In normal cases, even if the baking time is longer, there are only problems that a TFT channel is covered by the photoresist and the photoresist film is thick, but no obvious impact is caused on the display performance.

Optionally, in this embodiment, a metal layer is formed on the first surface of the etching stop layer, a layer of photoresist is deposited on the first surface of the metal layer, and in a step in which one mask manufacturing process is performed on the photoresist and a photoresist layer of a preset shape is formed through exposure development, the photoresist layer having a thickness of 1 to 2.5 µm and a width of 1 µm to 10 µm is formed.

In this solution, when at least the photoresist on the source and the drain are deposited, a longer deposition time may be additionally set, so that the photoresist is thicker than that obtained by using the original manufacturing process, In this way, after the photoresist layer of the preset shape is formed through exposure development, the photoresist layer is relatively thick, and in the post-baking step, a sufficient amount of photoresist flows and covers the channel, to avoid that the photoresist layer on the source and the drain and the photoresist on the channel are excessively thin, thereby improving a capability of protecting the channel. The photoresist flowing to and covering the channel functions the same as the ESL structure does in protection, to avoid etching on the semiconductor layer. Particularly, when the semiconductor is an oxide semiconductor layer, the semiconductor can take a better effect in resisting oxide etching acid. In addition, during exposure development, a photoresist pattern that more easily flows can be formed, for example, photoresist whose edges are perpendicular to each other can be formed. The photoresist of such a shape more easily flows and covers the channel than A-shaped metal does.

Optionally, in this embodiment, after the step of baking the photoresist layer remained on the first surfaces of the source and the drain at a baking temperature of 80 to 200 degrees for 50 to 180 seconds, the method further includes:

after the post-baking process is completed, detecting or sampling the baking status; and if the detected baking status meets a preset requirement, determining that the post-baking step is qualified.

In this solution, generally, in the post-baking step, after the material, the baking height, the baking temperature, and the baking time are determined, it can be ensured that a photoresist flowing effect during baking achieves a required effect, and moreover, due to a relatively high tolerance, the product is usually qualified. However, in some case, to manufacture products with superior quality, after baking is completed, inferior-quality products or even a large number of inferior-quality products can be effectively avoided by detection or sampling, to ensure that a finally formed display panel can reach a superb-quality display effect. Moreover, if technologies are satisfied, real-time monitoring devices can further be used, to monitor the step of post-baking and photoresist flowing in real time. When it is detected that the baking effect reaches a preset threshold, baking is stopped. The threshold may be that the photoresist is seen to fully cover the channel or a channel covering ratio reaches a preset ratio. In this way, cases of insufficient baking or over-baking are avoided, thereby laying a desirable foundation on subsequent manufacturing process and improving the product yield.

To better explain the solution in the present disclosure, FIG. 3 shows a schematic structural diagram of a manufacturing process corresponding to a manufacturing process method according to the present disclosure.

The first structural diagram in FIG. 3 shows a manufacturing process of forming an M1 metal layer 20 (which can form a gate metal layer) and a gate insulating layer 30 on a first surface of a glass substrate 10.

The second structural diagram in FIG. 3 shows a manufacturing process (including deposition and dry etching) of a semiconductor layer 40 (which may be an oxide semiconductor layer such as IGZO) and an etching stop layer 50 (a film layer of an ESL structure).

The third structural diagram in FIG. 3 shows a manufacturing process of an M2 metal layer 60 (which can form a source and a drain by performing steps such as physical vapor deposition) and a photoresist layer 70 (formed by performing steps such as masking and exposure development). In this manufacturing process, after the M2 metal layer is etched, the photoresist layer is not removed or peeled off temporarily.

The fourth structural diagram in FIG. 3 shows a manufacturing process of post-baking the glass substrate, so that the photoresist on the first surface of the metal layer 60 flows and covers a channel. In this manufacturing process, the photoresist in the channel can be covered by the photoresist without peeling off the photoresist on the first surface of the M2 metal layer and then re-forming photoresist, fewer masks are used, and protection and an anti-etching capability on the channel are improved.

The fifth structural diagram in FIG. 3 shows a manufacturing process of etching the semiconductor layer 40.

The sixth structural diagram in FIG. 3 shows a manufacturing process of clearly peeling off the photoresist layer 70 on the first surface of the M2 metal layer 60, a manufacturing process of forming a passivation layer 80 and an ITO layer 90, and a subsequent manufacturing process.

A data line is, besides the TFT, located on the M2 metal layer and the first surface of the semiconductor layer, and manufactured with the source and the drain in a same manufacturing process. In this solution, the data line and the source and the drain are formed on a same layer, so that the mask manufacturing process can be simplified; and the IGZO layer below the data line metal layer and the photoresist layer on the first surface are also formed on the same layer and corresponding to the source and the drain, so that the mask manufacturing process is simplified, the production efficiency is improved and the production costs are reduced.

FIG. 4 is a schematic diagram of a display panel according to the present disclosure. It may be learned with reference to FIG. 4 that the present disclosure further provides a display panel 100, including an array substrate 101 manufactured according to the method adapted to manufacture an array substrate disclosed in the present disclosure, a contralateral substrate 103 arranged opposite to the array substrate 101, and a liquid crystal layer 102 sandwiched between the array substrate 101 and the contralateral substrate 103.

The contralateral substrate generally refer to a color film substrate. Certainly, if the array substrate is a color filter on array (COA), the contralateral substrate is a simple glass substrate provided with a structure such as a common electrode. Certainly, display panels of other types are also acceptable if applicable to the manufacturing method in the present disclosure.

According to the display panel in the present disclosure, the array substrate is manufactured by using the method adapted to manufacture an array substrate disclosed in the present disclosure. In the manufacturing process method, one less mask is used in the manufacturing process of the TFT having the ESL structure. Specifically, after the source and the drain are etched, the photoresist on the first surfaces of the source and the drain is not removed or peeled off temporarily. Instead, for the TFT, and especially, for the photoresist layer on the first surfaces of the source and the drain, a post-baking operation is subsequently performed. The photoresist layer easily flows after baking, and diffuses outside the source and the drain into the channel in which the ESL structure is located. A photoresist layer is formed on the first surface of the ESL structure corresponding to the channel. In this way, the photoresist layer can take an effect of stopping etching together with the ESL layer in the subsequent step of etching the semiconductor layer. In this way, for the TFT, the photoresist layer can be formed on the first surface of the ESL structure without additionally adding a mask. In addition, a better etching stop effect is achieved than that achieved when the semiconductor layer is etched after the photoresist layer is peeled off, thereby improving the yield of products while simplifying a mask manufacturing process.

The panel of the present disclosure may be a twisted nematic (TN) panel, an in-plane switching (IPS) panel, or a multi-domain vertical alignment (VA) panel, or may certainly be a panel of any other suitable type.

The foregoing contents are detailed descriptions of the present disclosure in conjunction with specific embodiments, and it should not be considered that the specific implementation of the present disclosure is limited to these descriptions. A person of ordinary skill in the art can further make simple deductions or replacements without departing from the concept of the present disclosure, and such deductions or replacements should all be considered as falling within the protection scope of the present disclosure.

What is claimed is:

1. A display panel, comprising:
an array substrate;
a contralateral substrate, arranged opposite to the array substrate; and
a liquid crystal layer, sandwiched between the array substrate and the contralateral substrate;
wherein the array substrate is fabricated by the following operations:
forming a gate metal layer and a gate insulating layer on a first surface of a glass substrate;
forming a semiconductor layer on a first surface of the gate insulating layer, and forming an etching stop layer at a position corresponding to a channel of a thin film transistor;
forming a metal layer on a first surface of the etching stop layer;
depositing a layer of photoresist on a first surface of the metal layer, the photoresist covering the metal layer and the position of the channel, and performing one mask manufacturing process on the photoresist to form a photoresist layer of a preset shape through exposure and development, the photoresist layer of the preset pattern covering a source and a drain of the thin film transistor and not covering the etching stop layer corresponding to the position of the channel;
etching the metal layer to obtain the source and the drain of the thin film transistor, wherein during the process of etching the metal layer thus forming the source and the drain of the thin film transistor, the semiconductor layer disposed under the metal layer is left intact without being etched, and the photoresist layer of the preset pattern is not peeled off after the metal layer has been etched to form the source and the drain;
post-baking the photoresist layer of the preset pattern remained on first surfaces of the source and the drain to melt, allowing a portion of the photoresist layer of the preset pattern to flow to the position of the channel and again cover up the etching stop layer at the position of the channel, and allowing a remaining portion of the photoresist layer of the preset pattern to remain on the first surfaces of the source and the drain, leaving the source, the drain and the etching stop layer all covered up by the photoresist;
etching the semiconductor layer to form a preset pattern;
peeling off the photoresist layer on the first surfaces of the source, the drain, and on a first surface of the etching stop layer at the position of the channel; and
forming a passivation layer and an ITO layer on the first surfaces of the source, the drain, and the position of the channel;
wherein a width of the etching stop layer is greater than a width of the channel between the source and the drain;
wherein portions of the source and the drain adjacent to the channel are formed on the first surface of the etching stop layer;
wherein the gate metal layer has a greater width than that of the semiconductor layer, and wherein both ends of the gate metal layer along the width thereof extend beyond the respective two ends of the semiconductor layer along the width;
wherein the source is entirely disposed on an upper surface of the semiconductor layer other than the portion that is adjacent to the etching stop layer and that is disposed on the first surface of the etching stop layer;
wherein the source is entirely disposed on the upper surface of the semiconductor layer other than the portion that is adjacent to the etching stop layer and that is disposed on the first surface of the etching layer.

2. The display panel according to claim 1, wherein the semiconductor layer comprises an oxide semiconductor layer.

3. The display panel according to claim 2, wherein the semiconductor layer comprises an indium gallium zinc oxide semiconductor layer.

4. The display panel according to claim 1, wherein the operation of post-baking the photoresist layer of the preset pattern remained on the first surfaces of the source and the drain allowing a portion of the photoresist layer to flow to the position of the channel comprises:
   post-baking the photoresist layer of the preset pattern remained on the first surfaces of the source and the drain at a temperature that lies in the range of 80 to 200 degrees.

5. The display panel according to claim 4, wherein the operation of post-baking the photoresist layer of the preset pattern remained on the first surfaces of the source and the drain comprises:
   baking the photoresist of the preset pattern remained on the first surfaces of the source and the drain at the backing temperature lying in the range of 80-200 degrees for a continuous period of 50 to 180 seconds.

6. The display panel according to claim 1, wherein in the operations of forming a metal layer on a first surface of the etching stop layer, depositing a layer of photoresist on a first surface of the metal layer, and performing one mask manufacturing process on the photoresist to form a photoresist layer of a preset pattern through exposure and development, the photoresist layer having a thickness of 1 pm to 2.5 pm is formed.

7. The display panel according to claim 6, wherein in the operations of forming a metal layer on a first surface of the etching stop layer, depositing a layer of photoresist on a first surface of the metal layer, and performing one mask manufacturing process on the photoresist to form a photoresist layer of a preset pattern through exposure and development, the photoresist layer having a width of 1 pm to 10 pm is formed.

8. The display panel according to claim 5, wherein after the operation of baking the photoresist layer of the preset pattern remained on the first surfaces of the source and the drain at a baking temperature lying in the range of 80 to 200 degrees for a continuous period of 50 to 180 seconds, the following operation is further comprised for fabricating the array substrate:
   after the post-baking process is completed, detecting or sampling a baking status.

9. The display panel according to claim 8, wherein after the operation of baking the photoresist layer of the preset pattern remained on the first surfaces of the source and the drain at a baking temperature lying in the range of 80 to 200 degrees for a continuous period of 50 to 180 seconds, the following operation is further comprised for fabricating the array substrate:
   when the detected baking status meets a preset requirement, deciding that the post-baking operation is qualified.

* * * * *